US011917487B2

(12) United States Patent
Tessier-Lessard et al.

(10) Patent No.: US 11,917,487 B2
(45) Date of Patent: Feb. 27, 2024

(54) SYSTEM AND METHOD OF GEO-LOCATION FOR BUILDING SITES

(71) Applicant: 3990591 CANADA INC., Gatineau (CA)

(72) Inventors: Julien Tessier-Lessard, Gatineau (CA); Aleksandar Stevanovic, Gatineau (CA)

(73) Assignee: 3990591 CANADA INC., Gatineau (CA)

( * ) Notice: Subject to any disclaimer, the term of this patent is extended or adjusted under 35 U.S.C. 154(b) by 106 days.

(21) Appl. No.: 16/900,783

(22) Filed: Jun. 12, 2020

(65) Prior Publication Data

US 2020/0396563 A1    Dec. 17, 2020

Related U.S. Application Data

(60) Provisional application No. 62/861,798, filed on Jun. 14, 2019.

(51) Int. Cl.
*H04W 4/02* (2018.01)
*G06Q 50/16* (2012.01)
(Continued)

(52) U.S. Cl.
CPC .......... *H04W 4/027* (2013.01); *G06F 30/13* (2020.01); *G06Q 50/165* (2013.01); *H04W 4/029* (2018.02)

(58) Field of Classification Search
CPC ....... H04W 4/027; H04W 4/029; H04W 4/33; H04W 4/02; G06F 30/13; G01S 1/045;
(Continued)

(56) References Cited

U.S. PATENT DOCUMENTS 10,699,478 B1    6/2020    Chu et al.
10,733,775 B1    8/2020    Chu et al.
(Continued)

FOREIGN PATENT DOCUMENTS

WO    WO2014026021 A1    2/2014
WO    WO-2015107252 A1 *  7/2015    ............... G01S 5/12

OTHER PUBLICATIONS

Hindawi Advances in Civil Engineering vol. 2020, Article ID 2473138, 12 pages Sungjin Ahn, Taehui Kim, Young-Jun Park, and Ji-Myong Kim Improving Effectiveness of Safety Training at Construction Worksite Using 3D Bim Simulation Feb. 29, 2020 https://doi.org/10.1155/2020/2473138.

(Continued)

*Primary Examiner* — Brandon J Miller
(74) *Attorney, Agent, or Firm* — Eugene F. Derenyi

(57) ABSTRACT

Disclosed herein are techniques of geo-location for building sites including: providing means for determining a precise position; providing an application; starting the application; providing at least one feature option to the user of the application, the at least one feature option including at least one option that uses the precise position; acting upon at least one feature action on behalf of the user, the at least one feature action including at least one action that uses the at least one feature option; interacting with a 3D end point on the basis of the at least one feature action; and providing a final output that takes into account the interaction with the 3D end point. Users are enabled to precisely position building information that specifies precise construction deficiencies of a building site in a 3D model and to address those deficiencies during construction.

12 Claims, 13 Drawing Sheets

(51) Int. Cl.
  *H04W 4/029* (2018.01)
  *G06F 30/13* (2020.01)
(58) Field of Classification Search
  CPC ........ G01S 3/46; G01S 5/0036; G01S 5/0063; G01S 5/04; G01S 2201/03; G01S 2205/02; H04L 67/12; H04L 67/18
  See application file for complete search history.

(56) References Cited

U.S. PATENT DOCUMENTS

| | | | |
|---|---|---|---|
| 10,748,311 | B1 | 8/2020 | Chu et al. |
| 10,846,806 | B2* | 11/2020 | Sasson .................... G06V 20/20 |
| 10,854,016 | B1 | 12/2020 | Chu |
| 2013/0155058 | A1 | 6/2013 | Golparvar-Fard et al. |
| 2014/0274115 | A1* | 9/2014 | Michalson ............ H04W 4/029 455/456.1 |
| 2015/0310135 | A1 | 10/2015 | Forsyth et al. |
| 2015/0310669 | A1 | 10/2015 | Kamat et al. |
| 2018/0014150 | A1* | 1/2018 | Elias ........................ G07C 9/28 |
| 2018/0120443 | A1* | 5/2018 | Kandasamy .......... G01S 19/256 |
| 2019/0325089 | A1 | 10/2019 | Golparvar-Fard et al. |
| 2020/0402322 | A1 | 12/2020 | Chu |
| 2021/0063526 | A1* | 3/2021 | Aasen ............... H04M 1/72457 |

OTHER PUBLICATIONS www.mdpi.com/journal/applsci Appl. Sci. 2020, 10, 3390 Somaiieh Rokhsaritalemi, Abolghasem Sadeghi-Niaraki, and Soo-Mi Choi A Review on Mixed Reality: Current Trends, Challenges and Prospects Jan. 16, 2020 https://doi.org/10.3390/app10020636.

www.mdpi.com/journal/applsci Appl. Sci. 2020, 10, 5363 Jin Gang Lee, Joonoh Seo, Ali Abbas and Minji Choi End-Users' Augmented Reality Utilization for Architectural Design Review Aug. 3, 2020 https://doi.org/10.3390/app10155363.

Journal of Civil Engineering and Management 2020 vol. 26 Issue 1: 83-94 Ricardo L. Machado, Cesar Vilela Conceptual Framework for Integrating Bim and Augmented Reality in Construction Management Jan. 22, 2020, https://doi.org/10.3846/jcem.2020.11803.

The International Archives of the Photogrammetry, Remote Sensing and Spatial Information Sciences, vol. XLII-5/ W2, 2019 Measurement, Visualisation and Processing in BIM for Design and Construction Management S. Vincke, R.D.L. Hernandez, M. Bassier and M. Vergauwen Immersive Visualisation of Construction Site Point Cloud Data, Meshes and Bim Models in a VR Environment Using a Gaming Engine, Sep. 24-25, 2019, Prague, Czech Republic.

Engineering, Construction and Architectural Management vol. 26 No. 2, 2019 pp. 184-223 Emerald Publishing Limited Ruwini Edirisinghe Digital skin of the construction site: Smart sensor technologies towards the future smart construction site Sep. 25, 2018 DOI 10.1108/ECAM-04-2017-0066.

https://www.marketresearch.com/GlobalInfoResearch-v4117/Global-IoT-Construction-Company-Regions-13221449/ marketresearch.com Global IoT in Construction Market 2020 by Company, Regions, Type and Application, Forecast to 2025 (Abstract +TOC) Accessed Apr. 2, 2021.

https://www.marketresearch.com/Allied-Market-Research-v4029/IoT-Construction-Application-Machine-Control-13848249/ marketresearch.com IoT in Construction Market by Application (Machine Control, Site Monitoring, Fleet Management, Wearables, and Others), End User (Residential and Non-residential), and Component (Hardware, Software, Connectivity, and Services): Global Opportunity Analysis (Abstract+TOC), Accessed Apr. 2, 2021.

https://www.marketresearch.com/MarketsandMarkets-v3719/IoT-Construction-Offering-Hardware-Software-13028817/ marketresearch.com, IoT in Construction Market by Offering (Hardware, Software, Services), Project Type (Commercial, Residential), Application (Remote Operations, Safety Management, Fleet Management, Predictive Maintenance, Others), and Region—Global Forecast to 2024 (Abstract + TOC) Accessed Apr. 2, 2021.

https://www.marketresearch.com/360iResearch-v4164/IoT-Construction-Research-Project-Type-13977587/ marketresearch.com, IoT in Construction Market Research Report by Project Type (Commercial and Residential), by Offering (Hardware, Services, and Software), by Application—Global Forecast to 2025—Cumulative Impact of COVID-19 Accessed Apr. 2, 2021.

https://www.marketresearch.com/Lucintel-v2747/IOT-Global-Construction-Trends-Forecast-14125463/ marketresearch.com IOT in the Global Construction Market Report: Trends, Forecast and Competitive Analysis Accessed Apr. 2, 2021.

https://www.mdpi.com/journal/sensors Sensors 2021, 21, 837. https://doi.org/10.3390/s21030837 Shafie Panah, R.; Kioumarsi, M. Application of Building Information Modelling (BIM) in the Health Monitoring and Maintenance Process: A Systematic Review, Jan. 27, 2021.

Bastos Porsani, G.; Del Valle De Lersundi, K.; Sanchez-Ostiz Gutierrez, A.; Fernandez Bandera, C. Interoperability between Building Information Modelling (BIM) and Building Energy Model (BEM). Appl. Sci. 2021, 11, 2167. https://doi.org/10.3390/app11052167/ Mar. 1, 2021.

Automation in Construction 114 (2020) 103179 Calin Boje, Annie Guerriero, Sylvain Kubicki, Yacine Rezgui Towards a semantic Construction Digital Twin: Directions for future research https://doi.org/10.1016/j.autcon.2020.103179, Jun. 2020.

Automation in Construction 101 (2019) 127-139 Shu Tang, Dennis R. Shelden, Charles M. Eastman, Pardis Pishdad-Bozorgi, Xinghua Gao A review of building information modeling (BIM) and the internet of things (IoT) devices integration: Present status and future trends https://doi.org/10.1016/j.autcon.2019.01.020 , Feb. 2, 2019.

Zhenping Zhao et al.2019 IOP Conf. Ser .: Earth Environ. Sci. 371 022034 Integrating BIM and IoT for smart bridge management https://doi.org/10.1088/1755-1315/371/2/022034 Dec. 2019.

Appl. Sci. 2018, 8, 1086; doi:10.3390/app8071086 Kai-Ming Chang, Ren-Jye Dzeng Id and Yi-Ju Wu An Automated IoT Visualization BIM Platform for Decision Support in Facilities Management http:/dx.doi.org/10.3390/app8071086, Jul. 4, 2018.

marketresearch.com https://www.marketresearch.com/GlobalInfoResearch-v4117/Global-Construction-Site-Monitoring-System-13855574/Global Construction Site Monitoring System Market 2020 by Company, Regions, Type and Application, Forecast to 2025 (Table of Contents) Accessed Mar. 5, 2021.

marketresearch.com https://www.marketresearch.com/GlobalInfoResearch-v4117/Global-Construction-Site-Monitoring-System-13855574/ Global Construction Site Monitoring System Market 2020 by Company, Regions, Type and Application, Forecast to 2025 (Description) Accessed Mar. 5, 2021.

marketresearch.com https://www.marketresearch.com/GlobalInfoResearch-v4117/Global-IoT-Construction-Company-Regions-14159241/ (Abstract+Table of Contents) Global IoT in Construction Market 2021 by Company, Regions, Type and Application, Forecast to 2026 Accesed Apr. 2, 2021.

News Bites—Private Companies [Melbourne] (Dec. 3, 2020) Procore Technologies\AO Inc issued patent titled "Computer system and method for creating an augmented environment using QR tape".

Engineering, Construction and Architectural Management, vol. 27 No. 8, 2020, pp. 1647-1677 A review of integrated applications of BIM and related technologies in whole building life cycle Qingfeng Meng, Yifan Zhang, Zhen Li, Weixiang Shi, Jun Wang, Yanhui Sun, Li Xu, Xiangyu Wang https://doi.org/10.1108/ECAM-09-2019-0511 Sep. 21, 2020.

NASDAQ OMX's News Release Distribution Channel [New York] (Aug. 26, 2020) World Building Information Modeling (BIM) Market 2020-2025—$8.8 Billion Opportunity Assessment with Profiles of Autodesk, Nemetschek, Bentley Systems, Trimble and More.

* cited by examiner

CALCULATION OF POSITION THROUGH 3 ANGLES

SYSTEM AND METHOD OF GEO-LOCATION FOR BUILDING SITES

CROSS-REFERENCE TO RELATED APPLICATIONS

This application claims the benefit of convention priority to U.S. Provisional Patent Application No. 62/861,798 for "SYSTEM AND METHOD OF GEO-LOCATION FOR BUILDING SITES", by Julien Tessier-Lessard et al., filed Jun. 14, 2019, which is incorporated herein by reference in it's entirety.

TECHNICAL FIELD

This application relates to building information management in general, and to a system and method of geo-location for building sites, in particular.

BACKGROUND

There is a long felt need for coordinating building information in general, and site deficiencies in particular, during construction work. Some known solutions include the use of photographs and email communications, although these solutions may remain lacking when it comes to targeting precise site deficiencies.

SUMMARY

A system of one or more computers can be configured to perform particular operations or actions by virtue of having software, firmware, hardware, or a combination of them installed on the system that in operation causes or cause the system to perform the actions. One or more computer programs can be configured to perform particular operations or actions by virtue of including instructions that, when executed by data processing apparatus, cause the apparatus to perform the actions. One general aspect includes a method of geo-location for building sites, the method including the steps of: providing means for determining a precise position; providing an application; starting the application; providing at least one feature option to the user of the application, the at least one feature option including at least one option that uses the precise position; acting upon at least one feature action on behalf of the user, the at least one feature action including at least one action that uses the at least one feature option; interacting with a 3d end point on the basis of the at least one feature action; and providing a final output that takes into account the interaction with the 3d end point. The method of geo-location also includes thereby enabling users to precisely position building information that specifies precise construction deficiencies of a building site in a 3d model and to address those deficiencies during construction. Other embodiments of this aspect include corresponding computer systems, apparatus, and computer programs recorded on one or more computer storage devices, each configured to perform the actions of the methods.

One general aspect includes a system of geo-location for building sites, the system including: means for determining a precise position; an application; means for starting the application; at least one feature option provided to the user of the application, the at least one feature option including at least one option that uses the precise position; means for acting upon at least one feature action on behalf of the user, the at least one feature action including at least one action that uses the at least one feature option; means for interacting with a 3d end point on the basis of the at least one feature action; and means for providing a final output that takes into account the interaction with the 3d end point. The system of geo-location also includes thereby enabling users to precisely position building information that specifies precise construction deficiencies of a building site in a 3d model and to address those deficiencies during construction. Other embodiments of this aspect include corresponding computer systems, apparatus, and computer programs recorded on one or more computer storage devices, each configured to perform the actions of the methods.

Other aspects and features of the present application will become apparent to those ordinarily skilled in the art upon review of the following description of specific embodiments of a system and method of geo-location for building sites in conjunction with the accompanying drawing figures.

BRIEF DESCRIPTION OF THE DRAWINGS

Embodiments of the present application will now be described, by way of example only, with reference to the accompanying drawing figures, wherein.

Like reference numerals are used in different figures to denote similar elements.

DETAILED DESCRIPTION OF THE DRAWINGS

Figure 1:
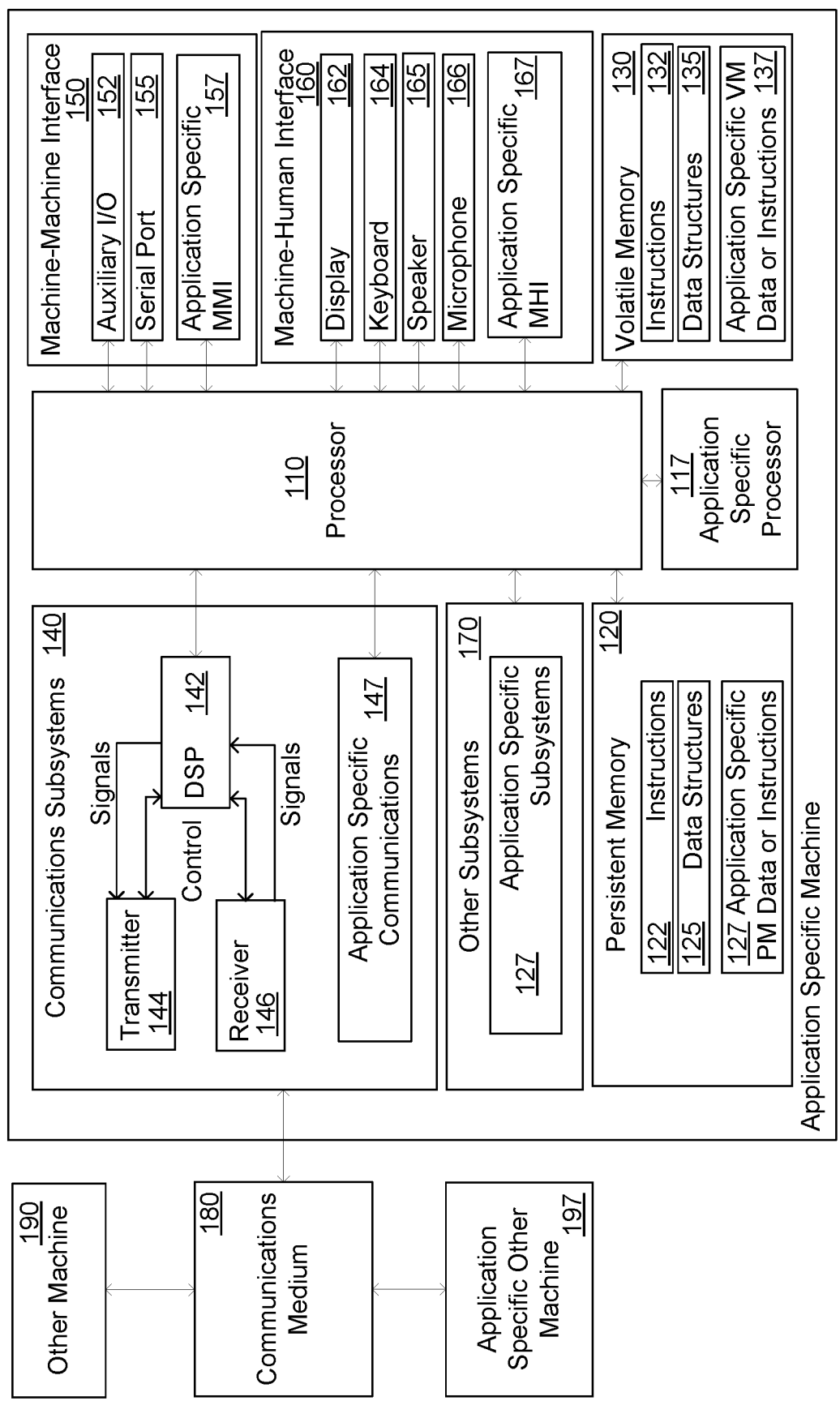
FIG. 1 is a block diagram of an exemplary application specific machine environment that can be used with embodiments of the present application.

Referring to the drawings, FIG. 1 is a block diagram of an exemplary application specific machine environment that can be used with embodiments of the present application. Application Specific Machine 100 is preferably a two-way wireless or wired communication machine having at least data communication capabilities, as well as other capabilities, such as for example audio, and video capabilities. Application Specific Machine 100 preferably has the capability to communicate with other computer systems over a Communications Medium 180. Depending on the exact functionality provided, the machine may be referred to as a smart phone, a data communication machine, client, or server, as examples.

Where Application Specific Machine 100 is enabled for two-way communication, it will incorporate communication subsystem 140, including both a receiver 146 and a transmitter 144, as well as associated components such as one or more, preferably embedded or internal, antenna elements (not shown) if wireless communications are desired, and a processing module such as a digital signal processor (DSP) 142. As will be apparent to those skilled in the field of communications, the particular design of the communication subsystem 140 will be dependent upon the communications medium 180 in which the machine is intended to operate. For example, Application Specific Machine 100 may include communication subsystems 140 designed to operate within the 802.11 network, Bluetooth™, LTE network, and LoRa (Long Range digital wireless communication technology, such as provided by Cycelo of Grenoble France), those networks being examples of communications medium 180 including location services, such as satellite based services like GPS or the like including GLONASS, BDS, or Galileo for example, or other ways of determining longitude, latitude and altitude/elevation such as through triangulation using wireless signals and angle of arrival and/or time-of-arrival (phase and/or amplitude based), and/or inertial motion tracking using an IMU (Inertial Motion Unit) having 9 degrees of freedom, or any combination of these systems. Communications subsystems 140 not only ensures communications over communications medium 180, but also application specific communications 147. An application specific processor 117 may be provided, for example to process application specific data, instructions, and signals, such as for example for GPS, near field, or other application specific functions. Depending on the application, the application specific processor 117 may be provided by the DSP 142, by the communications subsystems 140, or by the processor 110, instead of by a separate unit.

Network access requirements will also vary depending upon the type of communications medium 180. For example, in some networks, Application Specific Machine 100 is registered on the network using a unique identification number associated with each machine. In other networks, however, network access is associated with a subscriber or user of Application Specific Machine 100. Some specific Application Specific Machine 100 therefore require other subsystems 127 in order to support communications subsystem 140, and some application specific Application Specific Machine 100 further require application specific subsystems 127. Local or non-network communication functions, as well as some functions (if any) such as configuration, may be available, but Application Specific Machine 100 will be unable to carry out any other functions involving communications over the communications medium 1180 unless it is provisioned. In the case of LTE, a SIM interface is normally provided and is similar to a card-slot into which a SIM card can be inserted and ejected like a persistent memory card, like an SD card. More generally, persistent Memory 120 can hold many key application specific persistent memory data or instructions 127, and other instructions 122 and data structures 125 such as identification, and subscriber related information. Although not expressly shown in the drawing, such instructions 122 and data structures 125 may be arranged in a class hierarchy so as to benefit from re-use whereby some instructions and data are at the class level of the hierarchy, and some instructions and data are at an object instance level of the hierarchy, as would be known to a person of ordinary skill in the art of object oriented programming and design.

When required network registration or activation procedures have been completed, Application Specific Machine 100 may send and receive communication signals over the communications medium 180. Signals received by receiver 146 through communications medium 180 may be subject to such common receiver functions as signal amplification, frequency down conversion, filtering, channel selection and the like, analog to digital (A/D) conversion. A/D conversion of a received signal allows more complex communication functions such as demodulation and decoding to be performed in the DSP 142. In a similar manner, signals to be transmitted are processed, including modulation and encoding for example, by DSP 142 and input to transmitter 144 for digital to analog conversion, frequency up conversion, filtering, amplification and transmission over the communication medium 180. DSP 142 not only processes communication signals, but also provides for receiver and transmitter control. For example, the gains applied to communication signals in receiver 146 and transmitter 144 may be adaptively controlled through automatic gain control algorithms implemented in DSP 144. In the example system shown in FIG. 1, application specific communications 147 are also provided. These include communication of information located in either persistent memory 120 or volatile memory 130, and in particular application specific PM Data or instructions 127 and application specific PM Data or instructions 137.

Communications medium 180 may further serve to communicate with multiple systems, including an other machine 190 and an application specific other machine 197, such as a server (not shown), GPS satellite (not shown) and other elements (not shown). For example, communications medium 180 may communicate with both cloud based systems and a web client based systems in order to accommodate various communications with various service levels. Other machine 190 and Application Specific Other machine 197 can be provided by another embodiment of Application Specific Machine 100, wherein the application specific portions are either configured to be specific to the application at the other machine 190 or the application specific other machine 197, as would be apparent by a person having ordinary skill in the art to which the other machine 190 and application specific other machine 197 pertains.

Application Specific Machine 100 preferably includes a processor 110 which controls the overall operation of the machine. Communication functions, including at least data communications, and where present, application specific communications 147, are performed through communication subsystem 140. Processor 110 also interacts with further machine subsystems such as the machine-human interface 160 including for example display 162, digitizer/buttons 164 (e.g. keyboard that can be provided with display 162 as a touch screen), speaker 165, microphone 166 and Application specific HMI 167. Processor 110 also interacts with the machine-machine interface 1150 including for example auxiliary I/O 152, serial port 155 (such as a USB port, not shown), and application specific MHI 157. Processor 110 also interacts with persistent memory 120 (such as flash memory), volatile memory (such as random access memory (RAM)) 130. A short-range communications subsystem (not shown), and any other machine subsystems generally designated as Other subsystems 170, may be provided, including an application specific subsystem 127. In some embodiments, an application specific processor 117 is provided in order to process application specific data or instructions 127, 137, to communicate application specific communications 147, or to make use of application specific subsystems 127.

Some of the subsystems shown in FIG. 1 perform communication-related functions, whereas other subsystems may provide application specific or on-machine functions. Notably, some subsystems, such as digitizer/buttons 164 and display 162, for example, may be used for both communication-related functions, such as entering a text message for transmission over a communication network, and machine-resident functions such as application specific functions.

Operating system software used by the processor 110 is preferably stored in a persistent store such as persistent memory 120 (for example flash memory), which may instead be a read-only memory (ROM) or similar storage element (not shown). Those skilled in the art will appreciate that the operating system instructions 132 and data 135, application specific data or instructions 137, or parts thereof, may be temporarily loaded into a volatile 130 memory (such as RAM). Received or transmitted communication signals may also be stored in volatile memory 130 or persistent memory 120. Further, one or more unique identifiers (not shown) are also preferably stored in read-only memory, such as persistent memory 120.

As shown, persistent memory 120 can be segregated into different areas for both computer instructions 122 and application specific PM instructions 127 as well as program data storage 125 and application specific PM data 127. These different storage types indicate that each program can allocate a portion of persistent memory 120 for their own data storage requirements. Processor 110 and when present application specific processor 117, in addition to its operating system functions, preferably enables execution of software applications on the Application Specific Machine 100. A predetermined set of applications that control basic operations, including at least data communication applications for example, will normally be installed on Application Specific Machine 100 during manufacturing. A preferred software application may be a specific application embodying aspects of the present application. Naturally, one or more memory stores would be available on the Application Specific Machine 100 to facilitate storage of application specific data items. Such specific application would preferably have the ability to send and receive data items, via the communications medium 180. In a preferred embodiment, the application specific data items are seamlessly integrated, synchronized and updated, via the communications medium 180, with the machine 110 user's corresponding data items stored or associated with an other machine 190 or an application specific other machine 197. Further applications may also be loaded onto the Application Specific Machine 100 through the communications subsystems 140, the machine-machine interface 150, or any other suitable subsystem 170, and installed by a user in the volatile memory 130 or preferably in the persistent memory 120 for execution by the processor 110. Such flexibility in application installation increases the functionality of the machine and may provide enhanced on-machine functions, communication-related functions, or both. For example, secure communication applications may enable electronic commerce functions and other such financial transactions to be performed using the Application Specific Machine 100.

In a data communication mode, a received signal such as a text message or web page download will be processed by the communication subsystem 140 and input to the processor 110, which preferably further processes the received signal for output to the machine-human interface 160, or alternatively to a machine-machine interface 150. A user of Application Specific Machine 100 may also compose data items such as messages for example, using the machine-human interface 1160, which preferably includes a digitizer/buttons 164 that may be provided as on a touch screen, in conjunction with the display 162 and possibly a machine-machine interface 150. Such composed data items may then be transmitted over a communication network through the communication subsystem 110. Although not expressly show, a camera can be used as both a machine-machine interface 150 by capturing coded images such as QR codes and barcodes, or reading and recognizing images by machine vision, as well as a human-machine interface 160 for capturing a picture of a scene or a user.

For audio/video communications, overall operation of Application Specific Machine 100 is similar, except that received signals would preferably be output to a speaker 134 and display 162, and signals for transmission would be generated by a microphone 136 and camera (not shown). Alternative voice or audio I/O subsystems, such as a voice message recording subsystem, may also be implemented on Application Specific Machine 100. Although voice or audio signal output is preferably accomplished primarily through the speaker 165, display 162 and applications specific MHI 167 may also be used to provide other related information.

Serial port 155 in FIG. 1 would normally be implemented in a smart phone-type machine as a USB port for which communication or charging functionality with a user's desktop computer, car, or charger (not shown), may be desirable. Such a port 155 would enable a user to set preferences through an external machine or software application and would extend the capabilities of Application Specific Machine 100 by providing for information or software downloads to Application Specific Machine 100 other than through a communications medium 180. The alternate path may for example be used to load an encryption key onto the machine through a direct and thus reliable and trusted connection to thereby enable secure machine communication.

Communications subsystems 140, may include a short-range communications subsystem (not shown), as a further optional component which may provide for communication between Application Specific Machine 100 and different systems or machines, which need not necessarily be similar machines. For example, the other subsystems 170 may include a low energy, near field, or other short-range associated circuits and components or a Bluetooth™ communication module to provide for communication with similarly enabled systems and machines.

The exemplary machine of FIG. 1 is meant to be illustrative and other machines with more or fewer features than the above could equally be used for the present application. For example, one or all of the components of FIG. 1 can be implemented using virtualization whereby a virtual Application Specific Machine 100, Communications medium 180, Other machine 190 or Application Specific Other Machine 197 is provided by a virtual machine. Software executed on these virtual machines is separated from the underlying hardware resources. The host machine is the actual machine on which the virtualization takes place, and the guest machine is the virtual machine. The terms host and guest differentiate between software that runs on the physical machine versus the virtual machine, respectively. The virtualization can be full virtualization wherein the instructions of the guest or virtual machine execute unmodified on the host or physical machine, partial virtualization wherein the virtual machine operates on shared hardware resources in an isolated manner, to hardware-assisted virtualization whereby hardware resources on the host machine are provided to optimize the performance of the virtual machine. Although not expressly shown in the drawing, a hypervisor program can be used to provide firmware for the guest or virtual machine on the host or physical machine. It will be thus apparent to a person having ordinary skill in the art that components of FIG. 1 can be implemented in either hardware or software, depending on the specific application. For example, while testing and developing the Application Specific Machine 100 may be provided entirely using an emulator for the machine, for example a smartphone emulator running Android™ or iOS™. When deployed, real smartphones would be used.

Each component in FIG. 1 can be implemented using any one of a number of cloud computing providers such as Microsoft's Azure™, Amazon's Web Service™, Google's Cloud Computing, or an OpenStack based provider, by way of example only. Thus, as will be apparent to a person having ordinary skill in the relevant field of art, depending on whether the environment in which operate the components of FIG. 1, the Communications medium 180 can be the Internet, an IP based medium such as a virtual, wired, or wireless network, an interconnect back plane on a host machine serving as a back bone between virtual machines and/or other real machines, or a combination thereof. For example, in the case of the communications subsystems 140, the Transmitter 144, Receiver 146 and DSP 142 may be unnecessary if the application specific machine is provided as a virtual machine. Likewise, when the application is a server provided as a virtual machine, the machine-human interface 160 and machine-machine interface 150 may be provided by re-use of the resources of the corresponding host machine, if needed at all.

Figure 2:
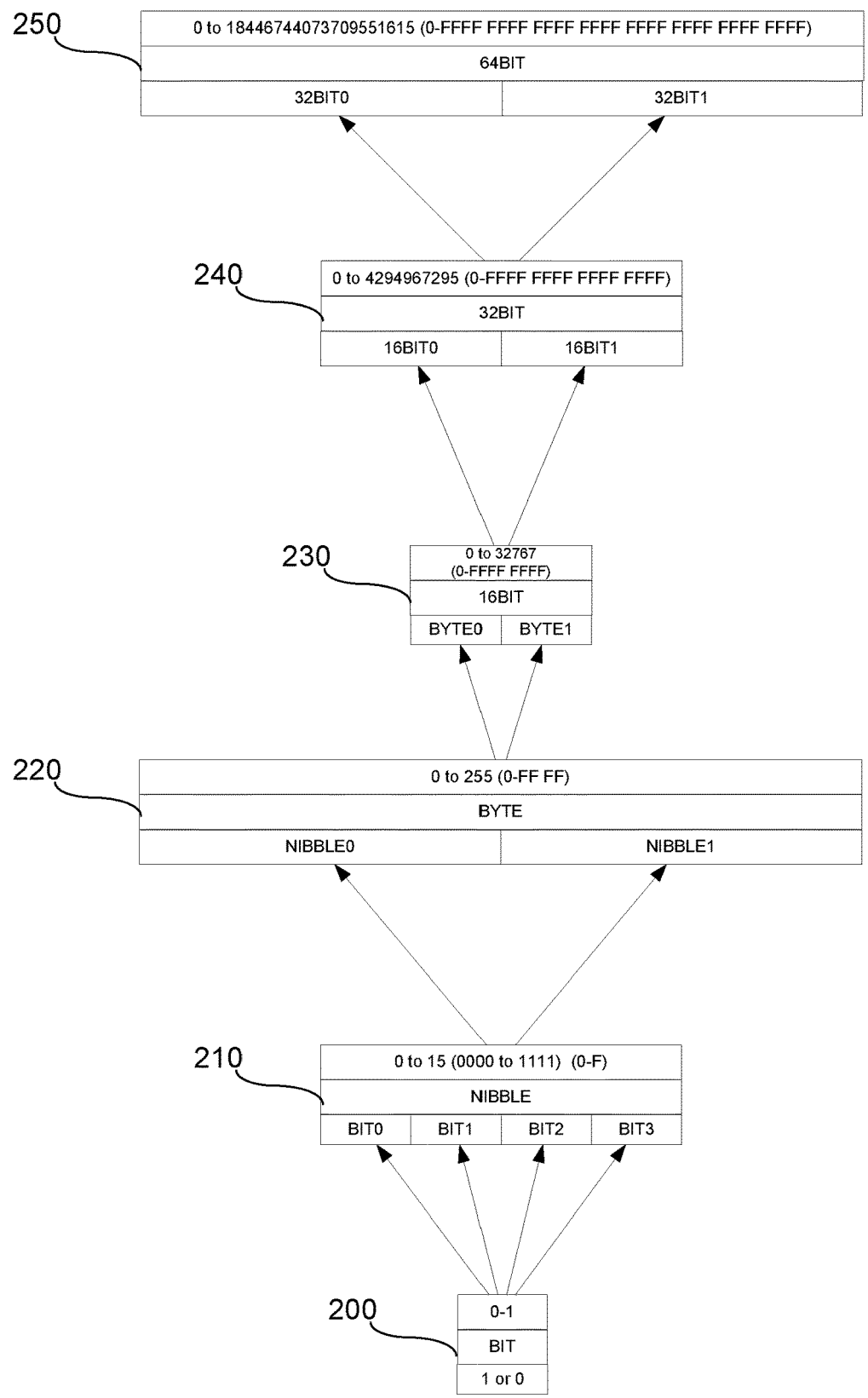
FIG. 2 is a block diagram of an exemplary collection of data representations for a bit, a nibble, a byte, a 16 bit, a 32 bit and a 64 bit values.

FIG. 2 is a block diagram of an exemplary collection of data representations for a bit, a nibble, a byte, a 16 bit, a 32 bit and a 64 bit values. A bit 200 is a binary data structure that can take on one of two values, typically represented by a 1 or a 0. In alternative physical realizations of a bit, the bit can be stored in read only memory, random access memory, storage medium, electromagnetic signals. Bits are typically realized in large multiples to represent vast amounts of data. A grouping four bits is called a nibble 210. Two nibbles form a bye 220. The byte 220 is of particular importance as most data structures that are larger groupings of bits than one byte are typically made up of multiples of bytes. Two bytes form 1 16 BIT 230 structure. Two 16 BIT structures form a 32 BIT 240 structure. Two 32 BIT structures form a 64 BIT 750 structure.

Figure 3:
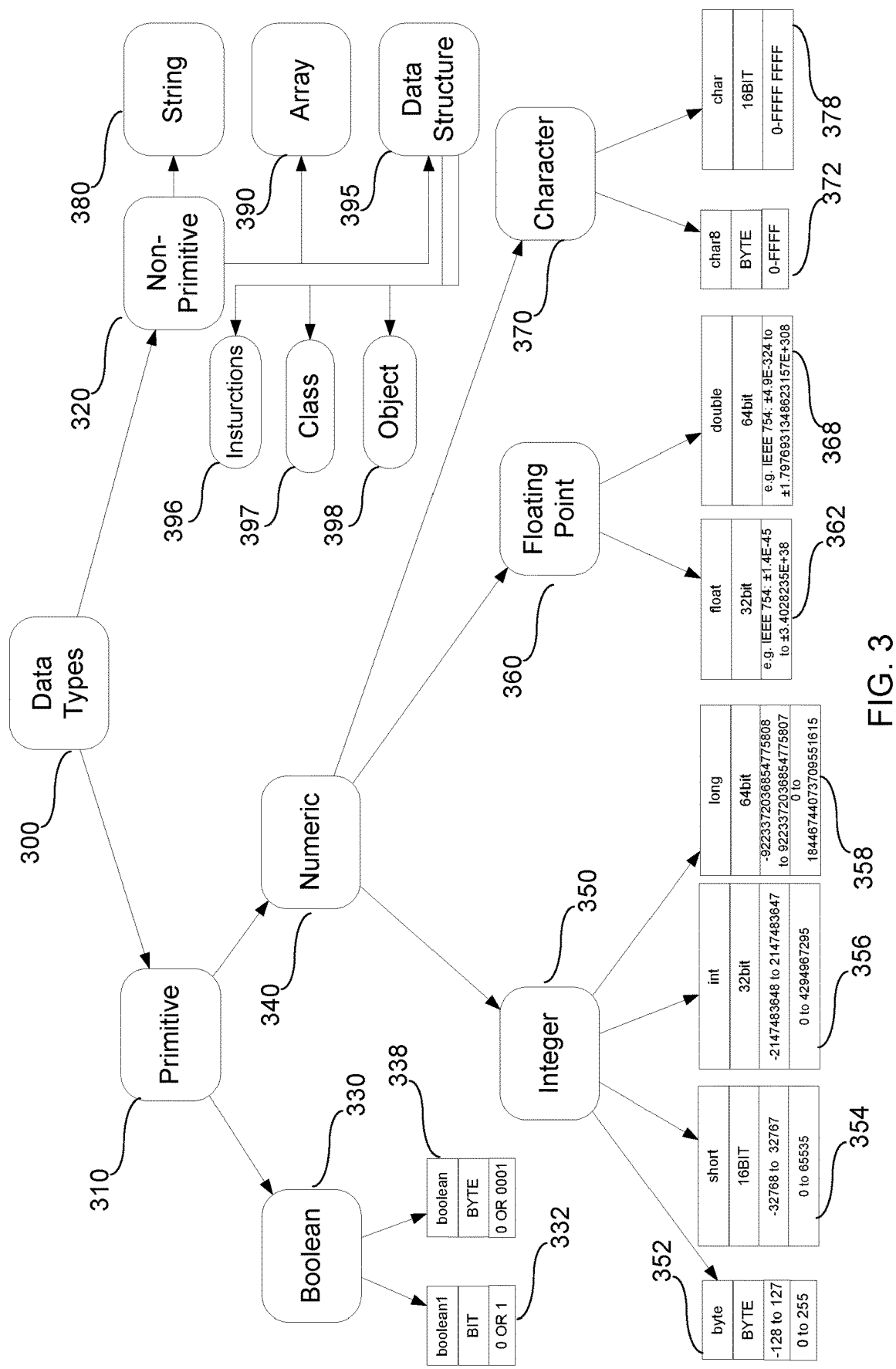
FIG. 3 is a block diagram of an exemplary collection of data types that uses the data representations of FIG. 2.

FIG. 3 is a block diagram of an exemplary collection of data types that uses the data representations of FIG. 2. Data types 300 are abstractions that represent application specific data using either primitive 310 or non-primitive constructs 320 The most fundamental primitive data type is a Boolean 330 data type, which can be represented using a single bit with the boolean1 332 data structure, or more frequently using a boolean 338 data structure that uses a single byte. More complex data types of the primitive data type is a Numeric 340 data type. Three broad examples of the Numeric 340 data type are the Integer 350 data type, the Floating Point 360 data type, and the Character 370 data types. A byte 352, a short 364, an int 366, and a long 368 are examples of Integer 350 Numeric 340 Primitive 310 Data Types 300 using a BYTE, 16 BIT, 16 BIT, 32 BIT and 64 BIT representation respectively. A float 362 and a double 368 are examples of Floating Point 360 Numeric 340 Primitive 310 Data Types and are represented using 32 BIT and 64 BIT representations respectively. Depending on the application, Integer 350 and Floating Point 360 Data Types 300 can be interpreted as signed or unsigned values. In contrast, Character 380 data types represent alphanumeric information. A char8 372 is represented using a single byte, while a char 378 is represented using a 16 BIT value, such as for example in ASCII or Unicode respectively. Having defined some example Primitive 310 Data Types 300, it is possible to build up Non-Primitive 320 Data Types 300 by combining Primitive 310 ones, such as for example a String 380 which is a collection of consecutive Character 370, an Array which is a collection of Primitive 310, and more generally, a Data Structure 395 which can be a collection of one or more Data Types 300. Of particular interest are instances of Data Structure 395 that can represent Instructions 396, Class 397, and Object 398. Instructions 396 are data structures that are processed by a given processor to implement a specific method or process. Some Instructions 396 work effectively with corresponding data and are packaged into templates that can be reused, such as code libraries, or as is shown in the drawing in a Class 397 which is a collection of attributes including Data Types 300 and methods including Instructions 396. A Class 397 can be arranged relative to other Classes in order to provide a Class hierarchy, a linked Data Structure 395 whereby one specific Class 397 is related to one or more other Classes by either "is a" or "has a" relationships. Furthermore, instances of a Class 397 can be instantiated into instances of an Object 398 of that given Class 397 at run time to provide a runtime context for attributes. Thus, it is possible to show the relationship between various Object 398 of specific Class 397 using entity relationship diagrams where each Object 398 or Class 397 is related to others using "is a" and "has a" relationships, and where attributes represent Data Types, and methods represent Instructions 396. Typically, attributes are shown using a variable name and methods are shown using a function name preceded by a set of parentheses "()". Thus, when illustrated in the present drawings, it will be understood that a person of ordinary skill in the art will know how to convert from these conventions into the Data Types 300 and Instructions 396 with are ultimately processed by computing systems.

Just like data can be represented in binary form, so can instructions for any one of the example processing units. Data representations and instruction sets are typically dependent on the processing units used, as is known in the art. In practice, any one of a number of instruction sets for respective processing units or family of processing units are used, and together referred to as an architecture, such as for example, without limitation the ARM architecture, previously Advanced RISC Machine, originally Acorn RISC Machine, which is a family of reduced instruction set computing (RISC) architectures for computer processors, configured for various environments. It is generally known to be able to translate flowcharts into mnemonics for computer instructions, and then encode those instructions as binary data to be processed by a given processor such that any flowchart shown in this application can be implemented using specific mnemonic or binary computer instructions given a specific architecture. The mnemonic representations are typically known as source code, and when in a form of a series of instructions known as binary code. There are several programming languages, interpreters, compilers and development environments whose purpose is to ultimately convert source code into binary representations of instructions targeting specific computing architectures.

Having described the environment in which the specific techniques of the present application can operate, application specific aspects will be further described by way of example only.

Figure 4:
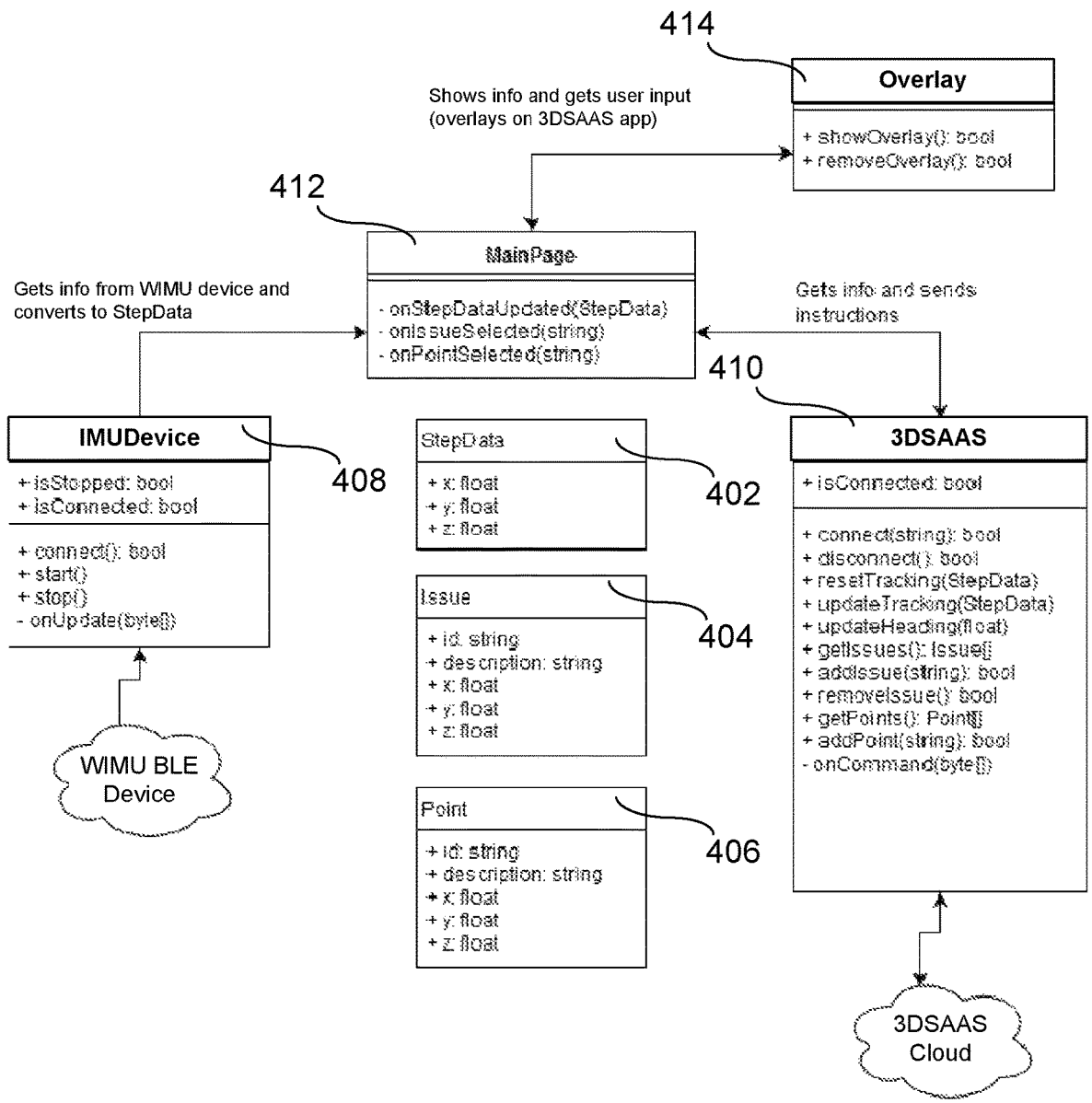
FIG. 4 is a class diagram illustrating some classes.

FIG. 4 is a class diagram illustrating some classes. Each class is illustrated in a rectangle with the name of the class at the top, followed by the names of attributes (if any), and the names of methods (if any). Each attribute, and methods returning a result, have a type specified by appending a colon ':' after their name. Each attribute and method can be specified as being public (can be accessed from an external program context of a class) by prefacing it with the '+' symbol or private (can only be accessed from the internal program context of a class) by prefacing it using the '-' symbol. The classes illustrated are StepData 402, Issue 404, Point 406, IMUDevice 408, 3DSAAS 410, MainPage 412 and Overlay 414. The StepData 402, Issue 404 and Point 406 classes each contain public x, y and z attributes of the float data type representing x, y and z coordinates. The Issue 404 and Point 406 classes also contain two public string (a non primitive data type that is an array of characters) attributes: id, and description, each used to hold a unique identifier, and a textual description respectively. The main difference between both is the purpose of access to this data. Issue 404 point 406 are categorized as issues or points of interest where something is flagged or want to bring in focus such as a conflict, deficiency or anything similar. The point 406 would be a geographical point 406 of reference to either calibrate or to reposition one within the 3D environment. They contain the same type of data however they are accessed for different purposes and contain different information. The StepData 402 contains data about a Step. A Step is a sequencing of Operations that is not limited to the IMU device used, and is a type of data used in the programming language. Two classes communicate with application 504 specific technology, the IMUDevice 408 class, and the 3DSAAS 410 class. The MainPage 412 class and Overlay 414 class are concerned with providing output to a user and getting input from a user. The IMUDevice 408 class includes two public bool attributes: isStopped, and isConnected; as well as three public methods, and a private method. The public methods are connect( ), which returns a bool result, start( ) and stop( ) which do not return any results, and onUpdate(byte[ ]), which does not return any results, but takes a byte array as an argument. The connect( )method returns the bool result true when successful, and false otherwise for the wireless function, e.g. Bluetooth Low Energy (BLE). The start( ) stop( ) methods are used to start and stop inertial motion tracking. The onUpdate( ) calls a function (passed to it as a pointer via the byte array argument) when there is an update in activity to continuously send data to a mobile through StepData 402. On the mobile device, several things can be done. An update of the coordinates can be received through onStepDataUpdate( ) and issues or points can be selected through onIssueSelected( ) and onPointSelected( ) respectively. Additionally, showOverlay( ) or removeOverlay( ) will trigger this data to be overlaid in 3DSAAS 410 or not (Boolean type). The 3DSAAS 410 can verify if there is a connection with the bool function isConnected( ) and if not connected, a connect( ) to Overlay 414 can be performed. A disconnect( ) can be performed in a similar fashion. For reference, since there are cumulative errors over time, an update and reset of the tracking can be performed though selection of points, resetTracking( ) and updateTracking( ). There are a few visual cues as well on the screen that are added through updateHeading( ). From here, it is possible to always get-Issues( ) addIssue( ) removeIssueQ, getPoint( ) and addPoint( ) which are self-explanatory functions to manipulate points and issues within the 3DSAAS 410 environment. onCommand( ) is a special function that can invoke actions to be performed upon request, using any of the above functions. The WIMU BLE Device, with which the IMUDevice 408 class operates can be, for example a Bluetooth Low Enrgy (BLE) wireless IMU device. An example is any one of the devices provided by Intertial Elements™ of Kanpur, India. The 3DSAAS 410 Cloud with which the 3DSAAS 410 class communicates can be for example the SmartShape™ software as a service (SAAS) from SmartShape™-Aerys North America, of Ottawa, Ontario Canada.

Figure 5:
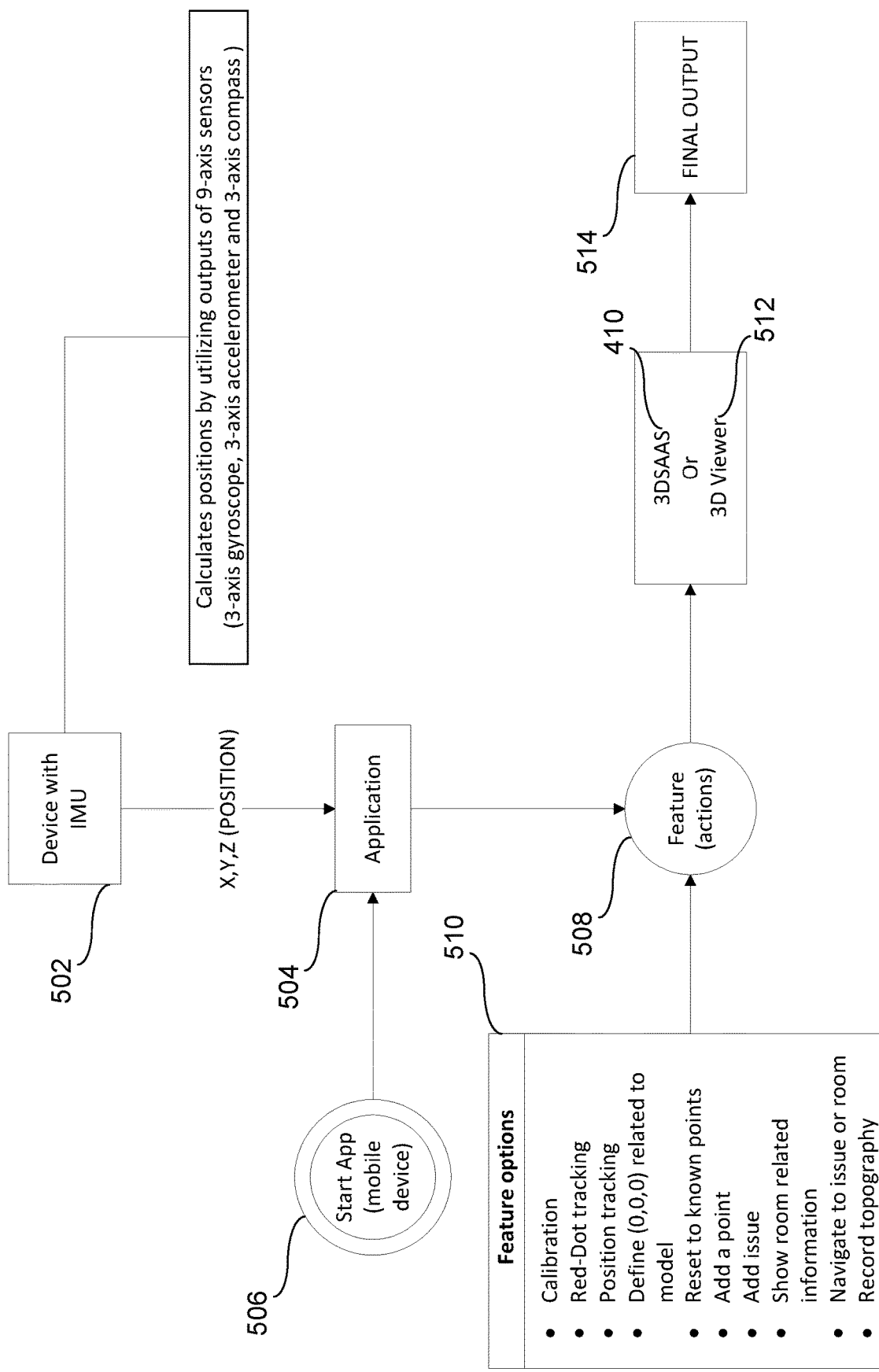
FIG. 5 is a block diagram illustrating inertial motion unit enabled dead position reckoning.

FIG. 5 is a block diagram illustrating inertial motion unit enabled dead position reckoning. FIG. 5 shows a Device with IMU 502 which calculates positions utilizing outputs of 9-axis sensors (3-axis gyroscope, 3-axis accelerometer and 3-axis compass), thus having 9 degrees of freedom, an Application 504, a Start App 506 (mobile device) step, Feature (actions) 508 step, Feature options 510, 3DSAAS 410 or 3D Viewer 512, and a Final Output 514. The device uses dead position reckoning to determine X,Y,Z(POSITION) which are used by the Application 504 interacting after the Start App 506 (mobile device) step to provide the Feature options 510 (including for example Calibration, Red-Dot tracking, Position tracking, Define (0,0,0) related to model, Reset to known points, Add a point 406, Add issue 404, Show room related information, Navigate to issue 404 or room, and Record topography) that are acted upon by Feature (actions) 508 step to interact with a 3D end point such as the 3DSAAS 410 or 3D Viewer 512 and arrive at the Final Output 514.

Figure 6:
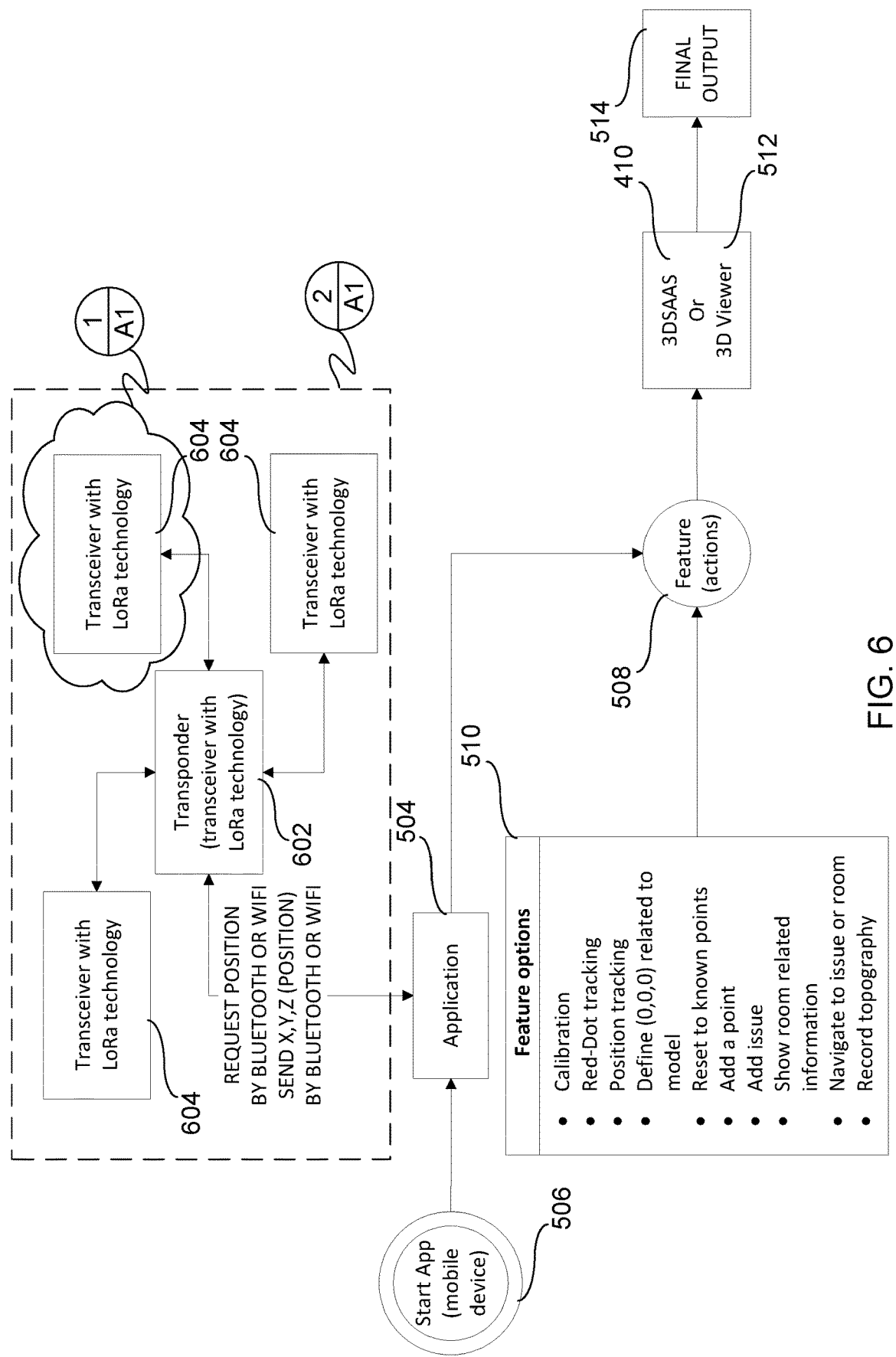
FIG. 6 is a block diagram illustrating triangulation of dead positioning reckoning by the use of angle-of-arrival or time-of-arrival using long-range wireless communication protocol technology.

FIG. 6 is a block diagram illustrating triangulation of dead positioning reckoning by the use of angle-of-arrival or time-of-arrival using long-range wireless communication protocol technology. FIG. 6 shows essentially the same components as FIG. 5, except that the role of the Device with IMU 502 is replaced by an angle-of-arrival or time-of-arrival system using long range wireless communication protocol technology such as, for example as illustrated, LoRA. The context is that there is a portable device, such as Transponder 602 (transceiver with LoRA technology 604) and a minimum of 3 other stationary devices, such as the three illustrated Transceiver with LoRa technology 604. The portable device has a Bluetooth or WIFI or other connection to a mobile device such as a pohone, tablet, or laptop such as, for example the illustrated Application 504, and also a LoRa antenna to send and receive signals. As illustrated, the Application 504 requests by Bluetooth or WiFi that the Transponder 602 (transceiver with LoRa technology 604) send X,Y,Z (position) by Bluetooth or WiFi. Although Bluetooth or WiFi are illustrated, USB or other wired connection or wireless connection could be used. The stationary devices are not illustrated with a Bluetooth or WiFi connection or other wired or wireless connection, but in an alternative embodiment it would be nevertheless be practical to have so as to connect the portable device to calibrate the position of the stationary devices—in the case illustrated this would be accomplished using a USB connection. Once the whole system is in place, the Start App 506 (mobile device) step can be taken and the Application connected via the portable device can start to send signals which are captured by the static devices. The static devices include a system of multi-antennas to be able to analyze the intensity of the signal and the time of arrived (Time Of Arrival or TOA—see FIGS. 9-13 for details) in each antenna in the array (see detail in FIGS. 7 and 8). To keep continuity, the angles will be updated according to a function onUpdate ( ) which will come to replace the preceding angle and will recompute new position X, Y, and Z. This is continued until the portable device is stopped. The portable device calculates position X, Y and Z continuously and updates the mobile device such as the telephone, tablet, or laptop via the Bluetooth or other connection.

Figure 7:
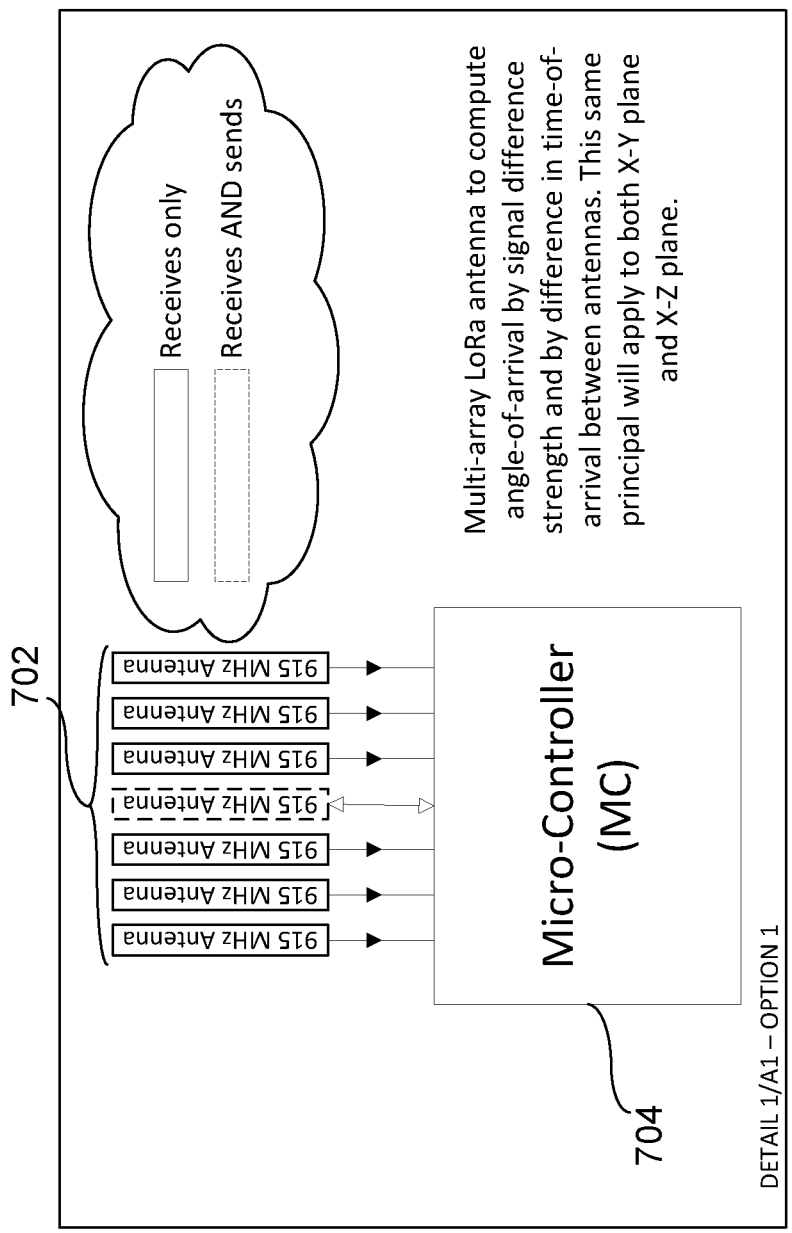
FIG. 7 is a block diagram illustrating a multi-array long-range wireless communication protocol antenna.
Figure 8:
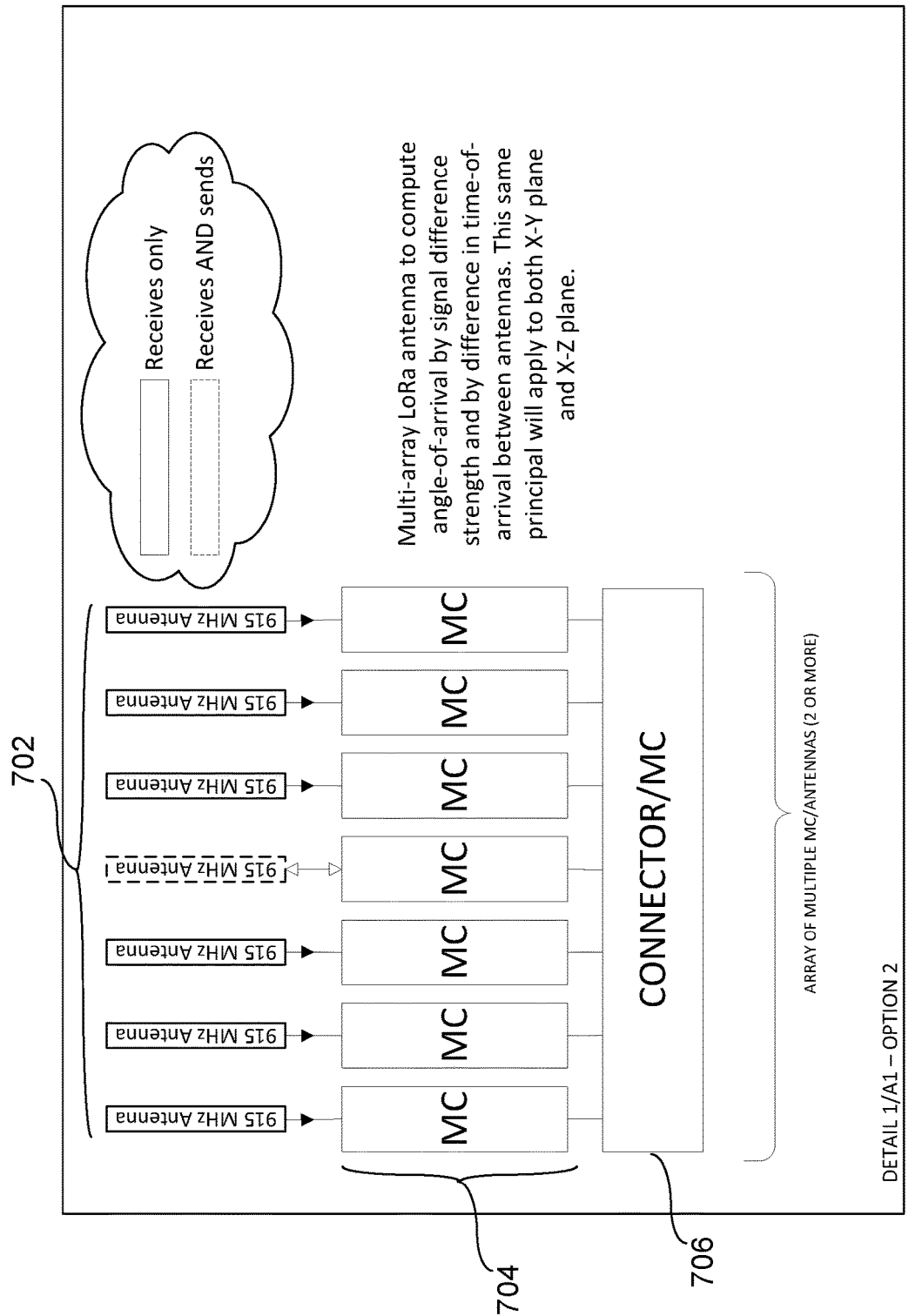
FIG. 8 is a block diagram illustrating another multi-array long-range wireless communication protocol antenna.

FIG. 7 is a block diagram illustrating a multi-array long-range wireless communication protocol antenna. FIG. 8 is a block diagram illustrating another multi-array long-range wireless communication protocol antenna. As shown in the FIGS. 7 and 8, several 915 MHz Antenna 702 are connected with at least one Micro-Controller 704 (MC) or multiple Micro-Controller 704 and a Connector/MC 706. As illustrated, all antennas are capable of receiving, and at least one antenna receives and sends. This arrangement would be integrated into the Transceiver with LoRa technology 604. In the case of the Transponder 602 (transceiver with LoRa technology 604) of FIG. 6, although not illustrated, in one embodiment it is contemplated that only one antenna capable of sending and receiving, or two antennas one for receiving, and the other for sending. The at least one antenna that sends and receives is the antenna which communicates and receives the data of the portable device. It is also the central reference of the calculation of the angle of the signal. To have static devices which do not use the energy necessary for operating several antennas simultaneously, one continuously makes a very fast cycle for alternating between the antennas, and in his way, one uses only one antenna at the same time technically and not the several antennas at the same time. This is controlled by a logic board and a multiplexer and/or the at least one microcontroller.

Figure 9:
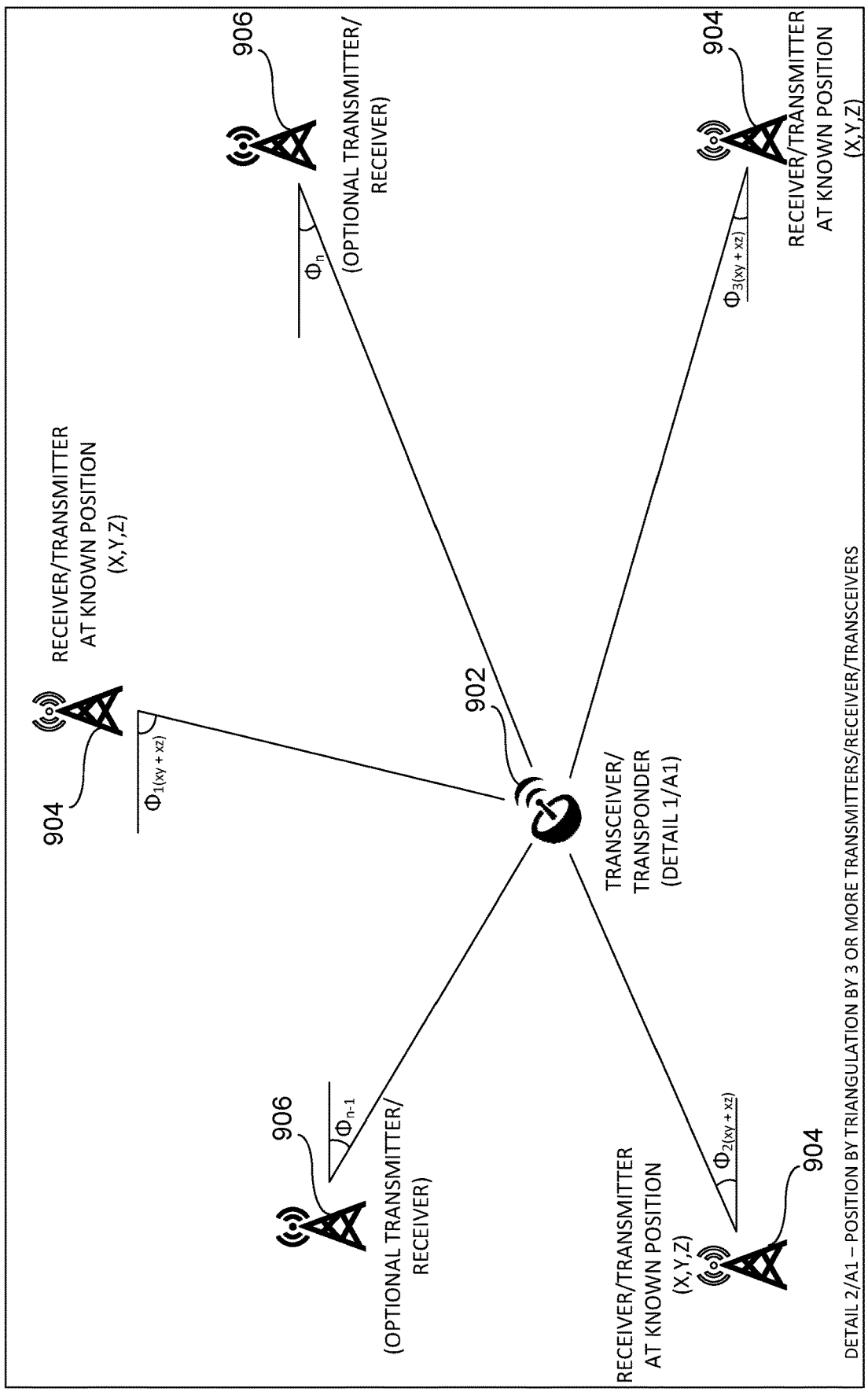
FIG. 9 is a block diagram illustrating determining position by triangulation by 3 or more transmitters/receiver/transceivers.
Figure 10:
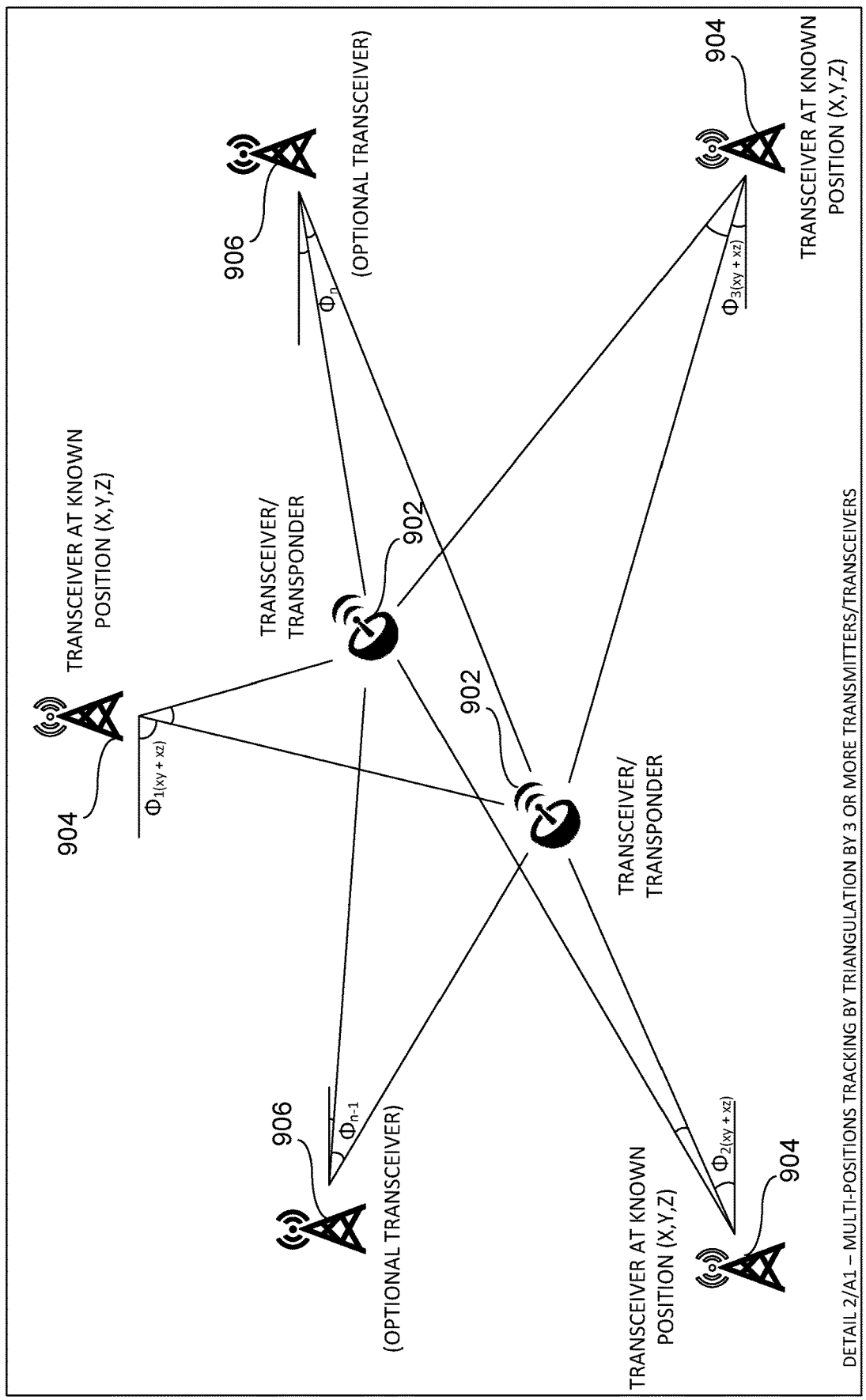
FIG. 10 is a block diagram illustrating determining position by triangulation by 3 or more transmitters/transceivers.

FIG. 9 is a block diagram illustrating determining position by triangulation by 3 or more transmitters/receiver/transceivers. FIG. 10 is a block diagram illustrating determining position by triangulation by 3 or more transmitters/transceivers. The figures show a transceiver/transponder 902 corresponding to the portable device, and at least three receiver/transmitters 904 at different known positions (X, Y, Z) delimiting the area that the portable device moves in. Two additional optional transmitter/receivers are shown and can be used, for example, to increase accuracy or for redundancy, for example in case of failure of one transmitter/receiver 906, or to achieve better coverage. The TOA is calculated to by a system involving signal phase, such that even if a signal is lost or signal strength is low, it will have the same signature in each antenna and with this, it is possible to calculate the angle of arrival of the signal with the same precision. This is illustrated by the various angles $\Phi 1, \Phi 2, \Phi 3, \ldots, \Phi n-1$, On as illustrated. In the static devices, one finds also an antenna which receives and which sends data. Once the angle calculated in the static devices, this is continuously fed back to the portable device by the central antenna to calculate its positions X, Y, and Z. As can be seen in FIG. 10, for a transceiver/transponder 902 at different (X,Y,Z) positions, the various angles various angles $\Phi 1, \Phi 2, \Phi 3, \ldots, \Phi n-1, \Phi n$ vary.

Figure 11:
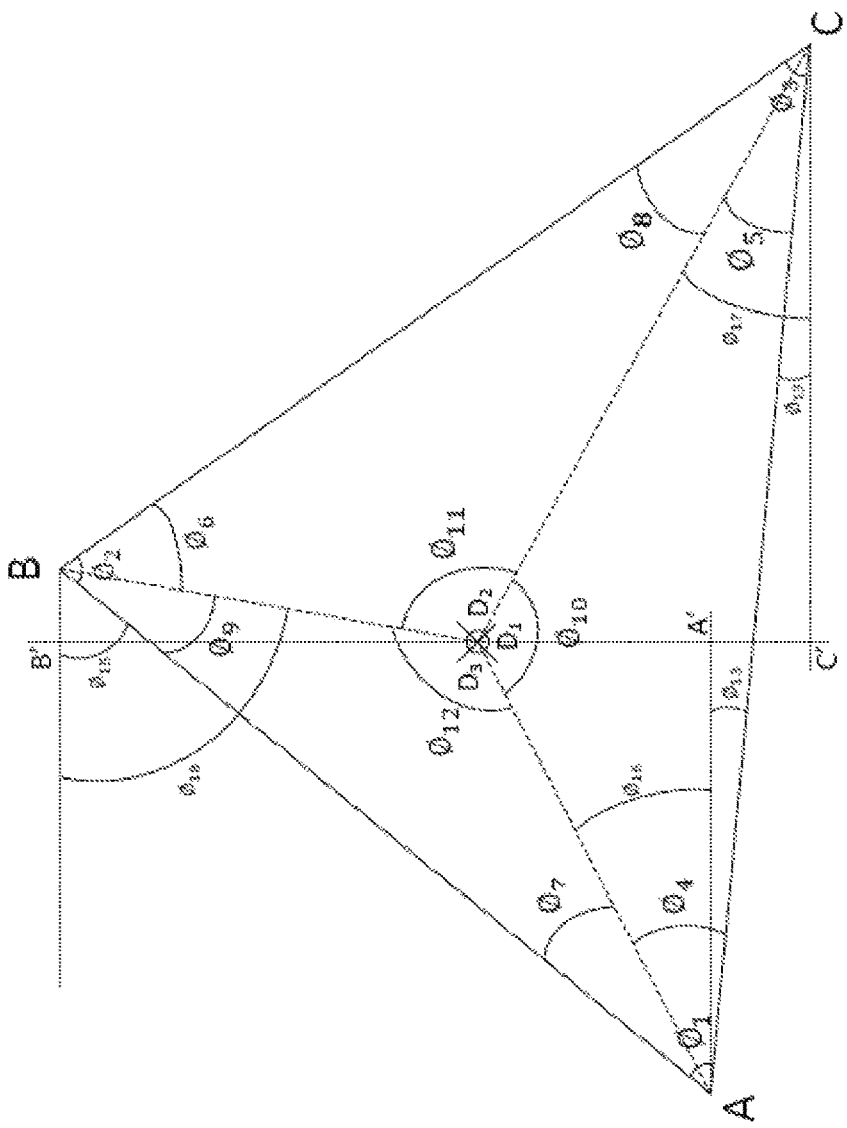
FIG. 11 is a diagram illustrating the calculation of a position through 3 angles.
Figure 12:
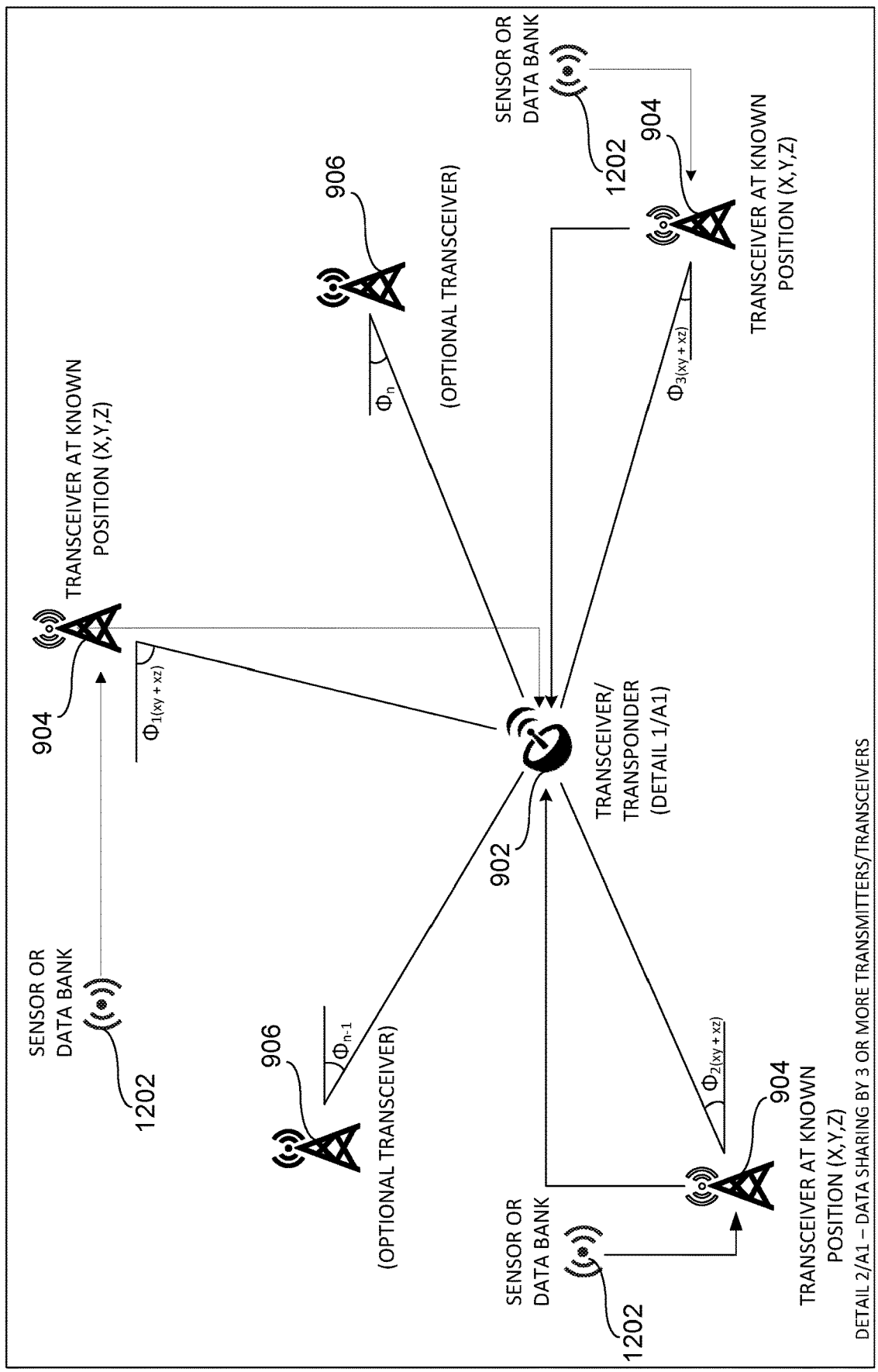
FIG. 12 is a block diagram illustrating data sharing by 3 or more transmitters/transceivers.
Figure 13:
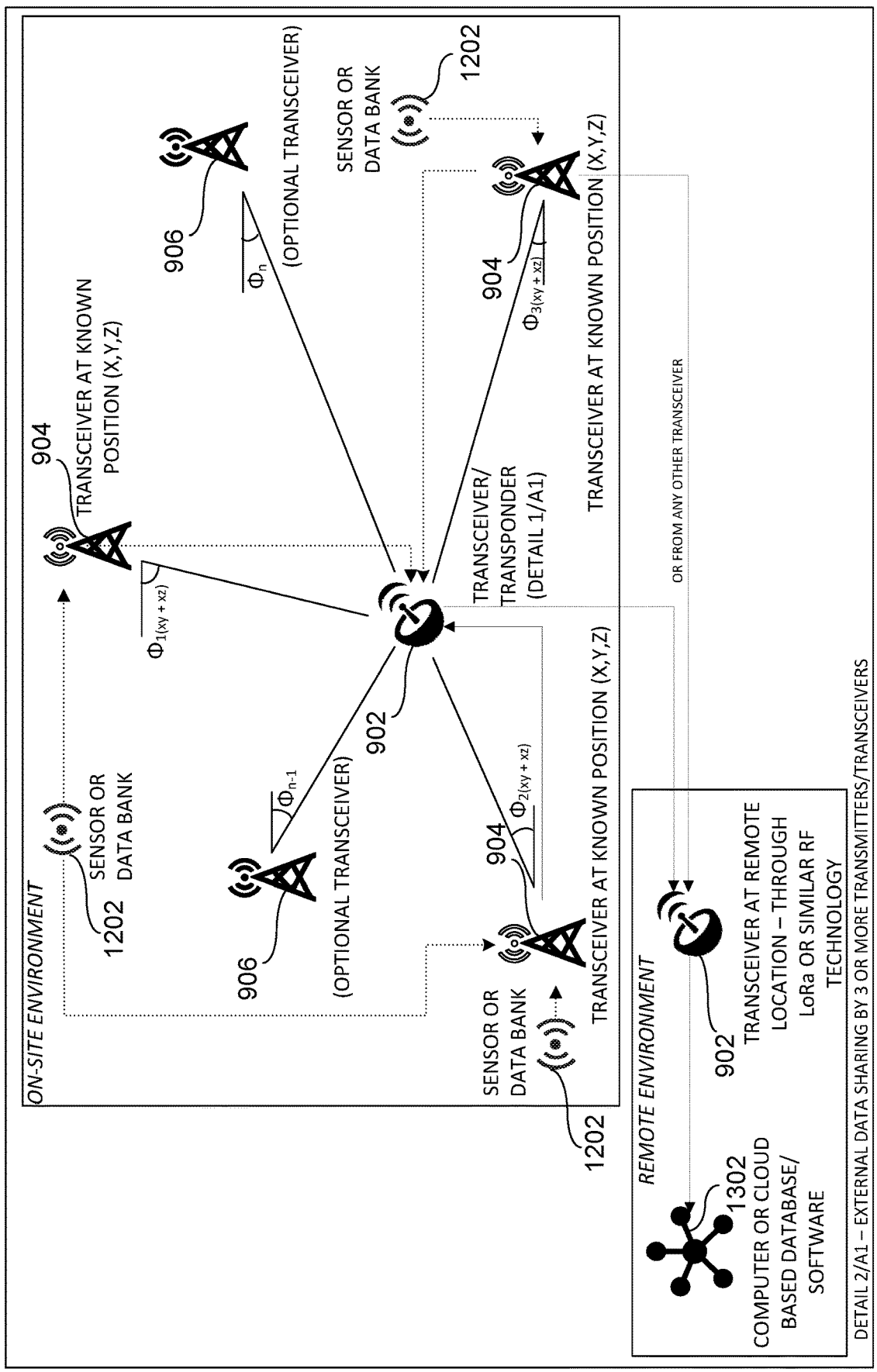
FIG. 13 is a block diagram illustrating external data sharing by 3 or more transmitters/transceivers.

FIG. 11 is a diagram illustrating the calculation of a position through 3 angles. As illustrated, points A, B, and C are at known positions, such as the positions of the transceivers, and point 406 D therebetween is at a position that needs to be determined through calculation, such as the position of a mobile device. As illustrated, angles $\Phi 1$, $\Phi 2$ and $\Phi 3$ are calculated using the vector distances between points A, B and C. Angles $\Phi 4$, $\Phi 5$ and $\Phi 6$ are obtained through input data, such as for example measurement of the angle of arrival of signals. Angles angles $\Phi 7$, $\Phi 8$, $\Phi 9$, $\Phi 8$ are calculated from the previous angles, point 406 coordinates, and distances. Several vectors are calculated from previously calculated quantities, resulting in three different coordinates for point 406 D: D1, D2 and D3. Finally, a DFINAL coordinate is obtained by taking the average of the three different coordinates for point 406 D. It is contemplated that if additional FIG. 12 is a block diagram illustrating data sharing by 3 or more transmitters/transceivers. FIG. 13 is a block diagram illustrating external data sharing by 3 or more transmitters/transceivers. The figures show a transceiver/transponder 902 corresponding to the portable device, and at least three transceivers at different known positions (X, Y, Z) delimiting the area that the portable device moves in. Two additional optional transceivers are shown and can be used, for example, to increase accuracy or for redundancy, for example in case of failure of one transceiver, or to achieve better coverage. The TOA is calculated to by a system involving signal phase, such that even if a signal is lost or signal strength is low, it will have the same signature in each antenna and with this, it is possible to calculate the angle of arrival of the signal with the same precision. This is illustrated by the various angles $\Phi 1, \Phi 2, \Phi 3, \ldots, \Phi n-1$, On as illustrated. In the static devices, one finds also an antenna which receives and which sends data. Once the angle calculated in the static devices, this is continuously fed back to the portable device by the central antenna to calculate its positions X, Y, and Z. As can be seen in FIG. 10, for a transceiver/transponder 902 at different (X,Y,Z) positions, the various angles various angles $\Phi 1, \Phi 2, \Phi 3, \ldots, \Phi n-1$, On vary. Also shown is three Sensor or Data Banks 1202 connected to each of three corresponding transceivers at known position (X,Y,Z). Sensors or Data Banks transmit information such as room temperature, concrete hardness, humidity, how many people came into a room, photo of a room, and other information that would be apparent to a person of ordinary skill in the art to which the Sensors or Data Banks pertain. FIG. 13 further shows similar components of FIG. 12 provided in an on-site environment wherein transceivers communicate with each other and with the transceiver/transponder 902 using LoRa or similar RF technology (as illustrated with dotted lines) as well as with a transceiver at remote location through LoRa or similar RF technology. The remote environment in which the treasceiver at remote location is situated further includes computer or cloud based database 1302 software/software in communication with the transceiver at remote location such that the on-site environment and the computer or cloud based database 1302/software is enabled to communicate with each other.

The above-described embodiments of the present application are intended to be examples only. Those of skill in the art may effect alterations, modifications and variations to the particular embodiments without departing from the scope of the application, which is defined in the claims appended hereto.

What is claimed is:
1. A method of geo-location for a building site, the method comprising the steps of:
(a) providing a portable device on a building site, the portable device using an angle-of-arrival or time-of-arrival system using a long-range wireless communication protocol technology using at least one transponder and at least three receiver/transmitters at known positions on the building site for determining a precise position of the portable device wherein the long-range wireless communication protocol technology includes at least one sensor or data bank connected to at least one receiver/transmitter;

(b) providing an application on the portable device;

(c) starting the application;

(d) providing at least one feature option to a user of the application, the at least one feature option including at least one option that uses the precise position;

(e) acting upon at least one feature action on behalf of the user of the application, the at least one feature action including at least one action that uses the at least one feature option;

(f) interacting with a 3D end point on the basis of the at least one feature action;

(g) the at least one sensor or data bank transmitting information on the building site to the portable device, the information selected from the group consisting of room temperature, concrete hardness, humidity, how many people came into a room, and photo of a room; and (h) providing a final output resulting from the interaction with the 3D end point, where the final output identifies a precise position of building information.

2. The method according to claim 1, wherein the long-range wireless communication protocol technology includes at least one optional transceiver.

3. The method according to claim 1, wherein the long-range wireless communication protocol technology includes at least one remote transceiver provided at a remote environment connected to a computer or cloud based database software.

4. The method according to claim 1, wherein the long-range wireless communication protocol technology is Long Range Wide Area (LoRA) technology.

5. The method according to claim 1, wherein at the step of providing the application occurs on an Application Specific Machine.

6. The method according to claim 1, wherein at the step of starting the application occurs on an Application Specific Machine.

7. The method according to claim 1, wherein the at least one feature option includes at least one of Calibration, Red-Dot tracking, Position tracking, Define (0,0,0) related to model, Reset to known points, Add a point, Add issue, Show room related information, Navigate to issue or room, or Record topography.

8. The method according to claim 1, wherein the 3D end point is a 3D SAAS or a 3D Viewer.

9. The method of claim 1, wherein the time-of-arrival is calculated by a system involving signal phase.

10. A system of geo-location for a building site, the system comprising:

(a) at least three receiver/transmitters at known positions on the building site;

(b) a portable device including a transceiver/transponder using a long-range wireless communication protocol technology to communicate with the three receiver/transmitters for determining a precise position of the portable device using an angle-of-arrival or time-of-arrival wherein the long-range wireless communication protocol technology includes at least one sensor or data bank connected to at least one of the receiver/transmitters;

(c) an application on the portable device;

(d) the application comprising functionality for starting the application;

(e) at least one feature option provided to a user of the application, the at least one feature option including at least one option that uses the precise position;

(f) the application comprising functionality for acting upon at least one feature action on behalf of the user the at least one feature action including at least one action that uses the at least one feature option;

(g) the application comprising functionality for interacting with a 3D end point on the basis of the at least one feature action;

(h) the at least one sensor or data bank comprising functionality for transmitting information on the building site to the portable device, the information selected from the group consisting of room temperature, concrete hardness, humidity, how many people carne into a room, and photo of a room; and (i) the application comprising functionality for providing a final output that results from the interaction with the 3D end point; where the final output identifies a precise position of building information.

11. The system of claim 10, wherein the long-range wireless communication protocol technology is Long Range Wide Area (LoRA) technology.

12. The system of claim 11, wherein the at least one feature option includes at least one of Calibration, Red-Dot tracking, Position tracking, Define (0,0,0) related to model, Reset to known points, Add a point, Add issue, Show room related information, Navigate to issue or room, or Record topography.

* * * * *